United States Patent [19]

Nigra et al.

[11] 4,160,996
[45] Jul. 10, 1979

[54] SWITCHABLE HIGH VOLTAGE GENERATOR FOR PENETRATION-TYPE COLOR CRT

[75] Inventors: Jacques Nigra, Velizy Villacoublay; Guy Vanthuyne, Arpajon, both of France

[73] Assignee: Compagnie Industrielle des Telecommunications Cit-Alcatel, Paris, France

[21] Appl. No.: 836,392

[22] Filed: Sep. 26, 1977

[30] Foreign Application Priority Data

Oct. 1, 1976 [FR] France ................................ 76 29692

[51] Int. Cl.² .................... H04N 9/27; G05F 1/56; H02J 1/00; H01J 29/80
[52] U.S. Cl. ........................................ 358/73; 307/77; 307/75; 315/170; 315/172; 320/1
[58] Field of Search .................................... 358/72-74, 358/190; 323/22 T; 315/411, 375, 170-172, 176; 307/56, 75-78, 85, 87; 320/1

[56] References Cited

U.S. PATENT DOCUMENTS

| | | | |
|---|---|---|---|
| 3,161,778 | 12/1964 | Harrison et al. | 307/77 |
| 3,659,190 | 4/1972 | Galluppi | 358/74 |
| 3,697,880 | 10/1972 | Melchior et al. | 358/74 |
| 3,723,855 | 3/1973 | Shuleshko | 307/77 |
| 3,892,977 | 7/1975 | Bierly | 307/77 |
| 3,914,617 | 10/1975 | Corbel | 307/75 |
| 4,104,564 | 8/1978 | Cohen et al. | 358/73 |

*Primary Examiner*—John C. Martin
*Attorney, Agent, or Firm*—Roland Plottel

[57] ABSTRACT

A very high voltage generator switchable between n levels for supplying a capacitative receiver, such as the screen of a polychrome display tube, and comprising a high voltage DC power source suitable for delivering two extreme levels of voltage straddling the n DC voltage levels. The power source is connected to the receiver via at least one series assembly of transistors for each direction of conduction between the power source and the receiver; each series assembly is associated with a control channel for the transistors elaborating an image signal of the error voltage between the value of voltage at the terminals of the receiver and the required level for the operation of each assembly as a switch, at least one of the control channels also comprising a modulator in which the image signal modulates the voltage of an oscillator for the operation of the corresponding assembly as a switching and regulating circuit connected in series with the receiver.

3 Claims, 1 Drawing Figure

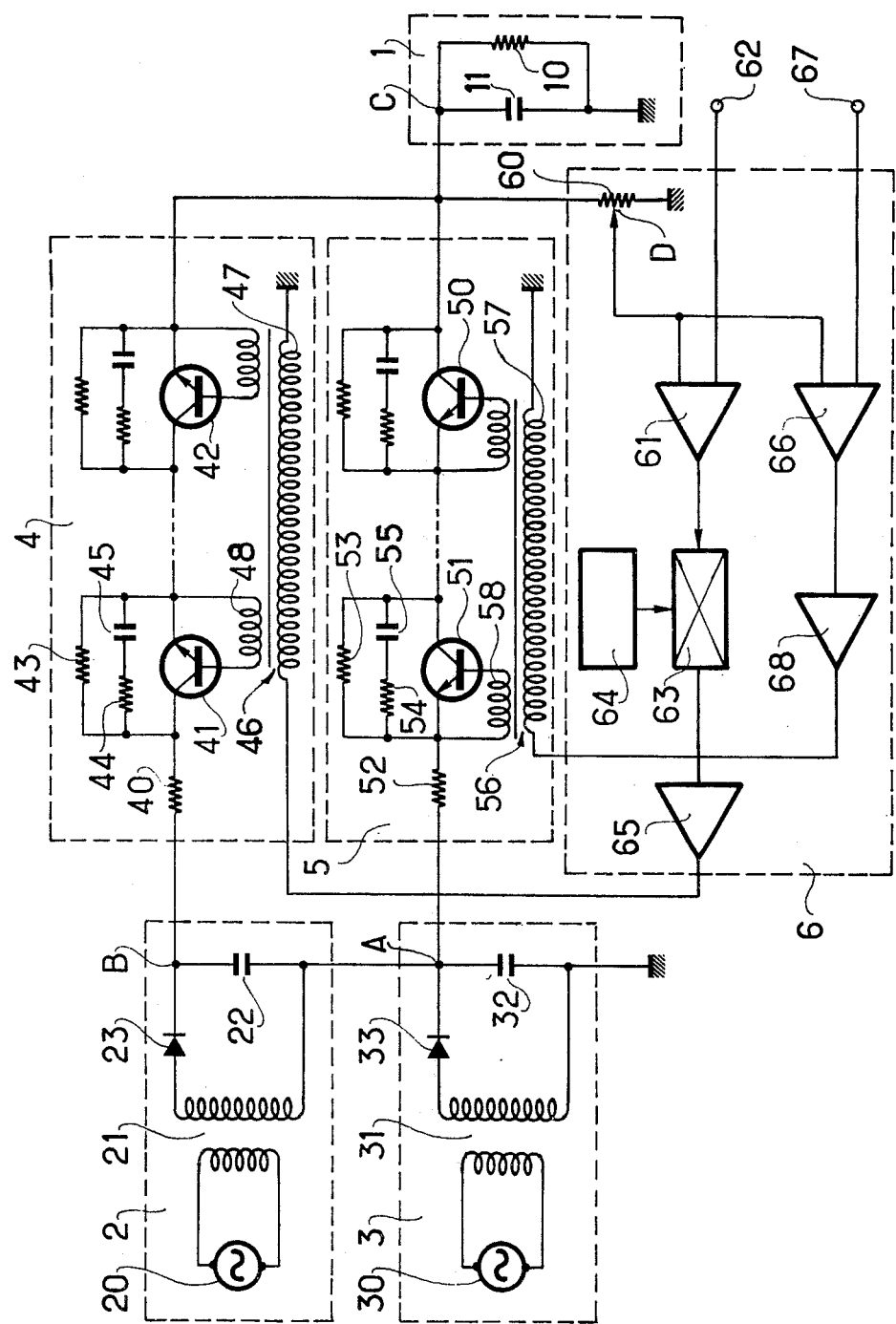

SWITCHABLE HIGH VOLTAGE GENERATOR FOR PENETRATION-TYPE COLOR CRT

The present invention relates to very high voltage generators for rapid switching of a very high voltage between several values, to be applied to a capacitative receiver. In particular, the capacitative receiver can be the anode of a polychrome cathode display tube.

In polychrome cathode tubes using variable electron penetration, the display colour is controlled by varying the anode voltage. The screen of the cathode tube can be constituted by two luminescent layers separated by a substance which forms a potential barrier. For example, the first luminescent layer which is directly subjected to the impact of the electron beam gives a red light for an anode voltage of 10 kilovolts: the second luminescent layer gives a green light for an anode voltage of 18 kilovolts. The second layer is separated from the first by the substance forming a potential barrier and is practically not energized by the anode voltage of 10 kilovolts; while for the anode voltage of 18 kilovolts, the penetration of the electrons increases so that they pass through the potential barrier and greatly energize the secoond layer whereas the first layer is not greatly energized.

A deflection of the electron beams and a switching of the electron acceleration voltage (anode voltage) between these two values allow red or green lines or lines of intermediate colours for intermediate values of the anode voltage to be made to appear on the screen of the cathode ray tube.

The important characteristics of a high voltage generator for applying a variable very high voltage to such a capacitive load are the rapidity of its switching so as to reduce the display capacity as little as possible, and the stable maintenance of the high voltage at the required value.

Now, since the cathode is earthed, the acceleration voltage is applied to the screen of the tube which constitutes a capacitative receiver: it has a parasitic capacity of a few hundreds of picofarads, e.g. 200 to 400pF, in relation to the tube earth screen. For the display in a given colour, the direct current flowing through the screen has a value of a few tens of microamperes to a few hundreds of microamperes according to the colour. The switching of the acceleration voltage from one value to another requires the screen capacitance to to charged or discharged; the charge or discharge currents can then reach about a hundred milliamperes, according to the difference between the two values, when switching is effected in a few tens of microseconds.

Taking these considerations into account, high voltage generators are known which can be switched between several levels, and which comprise a high voltage power source which feeds the capacitative receiver via an output resistor and which is associated to a voltage regulator circuit connected in parallel with said receiver. The voltage regulator is controlled by a signal which is an image of the difference between the value of the voltage at the terminals of the receiver and the required value, in order to define the value of the current passing through the output resistor of the power source and hence the drop in potential across its terminals, i.e. the potential applied to the screen. Further, this regulated high voltage power source is associated to an auxiliary circuit suitable for delivering a short positive or negative pulse having high energy sufficient for charging or discharging at the required value the capacitance of the receiver. The charge or the discharge of this capacitance being obtained by this auxiliary circuit, the regulated power source feeds the receiver.

The generator according to the present invention aims to fulfill the high voltage switching and regulation function by different circuitry.

The present invention provides a very high voltage DC generator which can be switched between n levels for feeding a capacitative receiver, comprising a very high voltage power source capable of delivering at least two extreme levels of voltage straddling the n DC voltage levels, a switching circuit for the rapid charging or discharging of the capacitance of the receiver, a high voltage regulation circuit for regulation at the required level, at least two series assemblies of power transistors each connected to the power source via a current limiting resistor and to the receiver and defining respectively two opposite directions of conduction between the source and the receiver and a control circuit having a transistor control channel for each series assembly of transistors, means in each transistor control channel for elaborating an image signal of the error voltage between the voltage value at the terminals of the receiver and the required level, which causes, as a function of the direction of conduction of said assemblies, the transistors of one of the series assemblies to operate in the saturated state as a switching circuit, at least one of the control channels further comprising a modulator receiving the signal of an oscillator and ensuring the modulation thereof by said image signal to control the transistors of the corresponding series assembly in the saturated state and then in the non-saturated state, as a function of the value of said error voltage signal image, for cusure operation of this assembly as a switching circuit and as a regulation circuit connected in series with the receiver.

Other characteristics and advantages of the present invention will become apparent from the description of an embodiment of the invention illustrated in the single FIGURE of the accompanying drawing, by way of example.

In this FIGURE, the capacitative receiver 1 is represented by a resistor 10 and a capacitor 11 connected in parallel and connected to earth. This capacitative receiver represents for example the anode of a polychrome display cathode tube to which there must be applied the acceleration voltage which is switchable between several predetermined values for display in definite colours. In the example illustrated, it has been considered that the acceleration voltage can assume two predetermined values, namely 10 kV and 18 kV, i.e. the display can be in two different corresponding colours (green and red).

The acceleration voltage or DC high voltage is delivered by two DC voltage sources 2 and 3 connected in series, one of the terminals of the source 3 being earthed.

Each of the DC voltage sources 2 and 3 is formed from an AC voltage source, 20 or 30, constituted by the mains or a low-voltage power source which feeds the primary winding of a step-up transformer 21 or 31, whose secondary winding is connected to a capacitor 22 or 32 via a diode 23 or 33. The transformation ratio of each transformer is suitably chosen, for example, the DC voltage obtained at the terminals of the capacitor 32 is 9 kV and that at the terminals of the capacitor 22 is 10 kV, defining two levels of the high voltage V1=9 kV at the point A on the connection between the capacitors 22 and 32 and V2=19 kV at the point B on the second terminal of the capacitor 32, straddling the two predetermined values 10kV and 18kV considered hereinabove of the voltage to be applied to the receiver 1.

The output of the power sources 2 and 3 in series, i.e. the point B, is connected to the receiver 1, point C, via a switching voltage regulator circuit 4. This circuit 4 is constituted by a resistor 40 and a series connection of balanced NPN type transistors 41, 42. The resistor 40 is connected between the point B and the collector of the first transistor 41; the emitter of the last transistor 42 of the series connection is connected to the receiver 1. A resistor 43 and a resistor 44 in series with a capacitor 45 are connected in parallel between the collector and the emitter of each of the transistors 41 or 42. Each of the transistors is controlled by an isolating transformer 46 having a primary winding 47 connected to earth and having as many identical secondary windings such as 48 as there are transistors 41 and 42 each secondary winding being connected between the base and the emitter of one of the series transistors of the circuit 4.

The output of the power source 3 i.e. point A is connected to the receiver 1, also at point C, via a second circuit 5, which here is an exclusively switching circuit. This circuit 5 is constituted by a series connection of balanced NPN transistors 50, 51 in which the collector of the first transistor 50 is connected to the receiver 1 and the emitter of the last transistor 51 is connected to the power source 3 at the point A via a resistor 52. A resistor 53 and a resistor 54 with a series capacitor 55 are connected in parallel between the emitter and the collector of each transistor 50, 51 of the circuit 5. These transistors are controlled by an isolating transformer 56 having a primary winding 57 connected to earth and having as many identical secondary windings such as 58 as there are transistors 50, 51 in the circuit 5, each of the secondary windings being connected between the base and the emitter of its transistor 50, 51.

The switching voltage regulator circuit 4 and the switching circuit 5 are associated with a control circuit 6 having two channels respectively controlling the circuit 4 and the circuit 5. This control circuit 6 includes a potentiometer 60 connected in parallel with the receiver 1 and which has an intermediate tap at the point D for sampling a voltage which is a function of the value of the high voltage applied to the receiver 1. The control channel of the circuit 4 comprises a differential amplifier 61, one of whose inputs is connected to the point D on the potentiometer 60 and whose other input receives a reference voltage applied to a control terminal 62. The output of this amplifier constitutes the modulating signal applied to an amplitude modulator 63 which receives the signal to be modulated from an oscillator 64. The oscillator operates at high frequency, e.g. 200 kHz. The modulated signal delivered by the modulator 63 is amplified in an amplifier 65 which applies it to the primary winding of the transformer 46 of the circuit 4.

The second channel of the control circuit 6 includes a second differential amplifier 66 one of whose imputs is connected to the point D on the potentiometer and whose other input receives a reference voltage applied to a control terminal 67. The output of the differential amplifier 66 is connected via an amplifier 68 to the primary winding 57 of the transistor control transformer 56 of the circuit 5.

The operation of this DC high voltage switchable transformer is described hereinbelow.

For the switching of the high voltage applied to the receiver 1, from the low value to the high value, i.e. for example from 10 kV to 18 kV and for the stable maintenance of the high voltage at this high value, i.e. 18 kV, a reference voltage U1 is applied to the reference input 62 of the operational amplifier 61. The reference voltage U1 is chosen to be equal to a proportion of required high value of the high voltage, as described by the ratio between the voltage at the terminals of the potentiometer 60 and the voltage D injected on the control input of the differential amplifier 61, i.e. U1 has the value of the voltage v which appears on the tap of the potentiometer 60 when the voltage at C is equal to the required high value 18 kV. The error signal at the output of the amplifier is high to begin with; it modulates the amplitude of the signal coming from the oscillator 64 to feed the transformer 46. The average voltage, between two positive peaks of the signal at the terminals of each secondary winding 48 connected between the base and the emitter of each of the transistors 41 and 42, controls these transistors which operate in the saturated state. The rapid charging of the capacitor 11 of the receiver 1 will then be obtained in a period of time determined by the RC time constant of the resistor 40 and the capacitor 11, the capacitance of the capacitor 22 is chosen to be manifestly higher than that of the capacitor 11 (in the order of at least twenty times). The voltage at C is then close to the high value required, namely 18 kV. The charging current passing through the transistors is limited by the resistor 40.

The error voltage delivered at the output of 61 drops to a low value. During the period of maintenance of the voltage at C at this high value, the error voltage at the output of the amplifier 61 continues to modulate the amplitude of the voltage of the oscillator 64 for feeding the transformer 46. However, since this error voltage is low, the amplitude of the modulated signal is too low to obtain the saturation state of the transistors 41, 42 which act as variable resistors in series with the receiver 1, the resistances of the transistors being inversely proportional to the error signal delivered by the differential amplifier 61 and modulating the voltage of the oscillator 64. The transistors 41 and 42 then constitute a circuit which regulates the high voltage at the point C, the current passing through the resistor 40 and the transistors then being very low.

The circuits such as 43, 44, 45, disposed between collector and emitter of each of the transistors 41 and 42 provide a balanced distribution of the voltages at the terminals of these transistors, both when switching and when regulating.

For switching followed by the maintenance of the high value of the high voltage at C, no control is applied to the input 67 of the control channel of the transistors 50, 51 of the circuit 5: these transistors are blocked.

For switching the high DC voltage, applied at C to the receiver 1, from the high value to the low value, i.e. from 18 to 10 kV and for maintaining the high voltage at this low value a two phase operation is used.

In a first phase, a reference voltage U2 is applied to the input 67, while the input 62 is not controlled. U2 is the image of the low value of the high voltage required at C, in an analogous manner to U1 which is the image of the high value of the voltage at C. The large error signal delivered by the amplifier 66 sets the transistors 50, 51 in the saturation state. They constitute series switches discharging the capacitor C in a time which is a function of the time constant $R_2C$ defined by the resistor 52 and the capacitor 11; since the capacitance of the capacitor 32 is chosen to be manifestly higher than that of the capacitor 11, (in the order of at least twenty times higher) it practically does not intervene. The discharge current of the capacitor 11 passing through the transistors 50, 51 in series is limited by the resistor 52. The quantity of electricity corresponding to the discharge of the capacitor 11 is recuperated in the capacitor 32, the voltage at the terminals of the capacitor 32 being however only slightly modified due to the high ratio existing between the capacitances of the capacitors 32 and 11.

In a second phase, the reference voltage U2 is applied to the reference input 62 of the differential amplifier 61, the input 67 of the amplifier 66 then no longer being controlled. In this second phase the small error voltage at the output of the differential amplifier 61 modulates the amplitude of the voltage of the oscillator 64 to control the transistors 41 and 42 operating as a regulator circuit in series with the receiver 1.

The circuit described also makes it possible to obtain intermediate high voltage values, lying between 10 kV and 18 kV and corresponding to display other colours, the corresponding reference voltages are applied to the inputs 62 and 67 in response to programmed orders corresponding to a change in colour of the display. In the case of a jump from one high voltage value to a higher value, the rapid charging of the capacitor of the receiver and the regulation at the high value of the voltage at the terminals of the receiver are provided for by a same circuit 4 operating as a switch and as a regulator connected in series with the receiver, while in the case of a jump from a high voltage value to a lower value, the rapid discharge of the capacitor of the receiver is ensured by the circuit 5 operating as a switch and the regulation at the lower value of the high tension is ensured by the circuit 4 then operating as a regulator in series with the receiver.

In a variant which is not shown, the control channel of the circuit can be modified and be analogous to the control channel of the circuit 4, for the circuit 5 to operate as a switch and as a regulator in the same way as circuit 4.

In another variant which is not shown, other sources of voltage will be associated to the sources 2 and 3 to define intermediate taps, circuits analogous to the circuits 4 and 5 enabling switching of the high voltage to the required values.

In another variant which is not shown, other power sources will be associated to the power sources 2 and 3 to define intermediate taps between A and B at values close to the intermediate voltages required and the resistor 52 can be switched to A or to any one of these intermediate taps; likewise the resistor 40 can be switched to B or to any one the intermediate taps; the controls of these switching operations can be delivered from the programmed controls also defining the reference voltages applied to the differential amplifiers of the control circuit.

What we claim is:

1. Very high voltage DC generator which can be switched between n levels for feeding a capacitative load, comprising a very high voltage power source capable of delivering at least two extreme levels of voltage straddling in the n DC voltage levels, at least two series assemblies of power transistors each connected to the power source via a current limiting resistor and to the load and defining respectively two opposite directions of conduction between the source and the load and a control circuit having a transistor control channel for each series assembly of transistors, means in each transistor control channel for elaborating an image signal of the error voltage between the voltage value at the terminals of the load and the required level, which causes, as a function of the direction of conduction of said assemblies, the transistors of one of the series assemblies to operate in the saturated state as a switching circuit, at least one of the control channels further comprising a modulator receiving the signal of an oscillator and ensuring the modulation thereof by said image signal to control the transistors of the corresponding series assembly in the saturated state and then in the non-saturated state, as a function of the value of said error voltage signal image, for ensuring operation of this assembly as a switching circuit and as a regulation circuit connected in series with the load.

2. Very high voltage generator according to claim 1, wherein the transistors of each assembly are controlled by an isolation transformer whose primary winding is fed by the signal at the output of the corresponding control channel and having as many secondary windings, connected respectively between base and emitter of the transistors, as there are transistors in its series assembly.

3. A very high voltage DC generator according to claim 1 and a cathode display tube whose anode during operation requires different voltage levels, said generator feeding said anode which has said capacitive load.

* * * * *